United States Patent [19]
Powell et al.

[11] Patent Number: 5,598,004
[45] Date of Patent: Jan. 28, 1997

[54] IMAGE DETECTOR

[75] Inventors: Martin J. Powell; John R. Hughes, both of Horley, England

[73] Assignee: U.S. Philips Corporation, New York, N.Y.

[21] Appl. No.: 504,195

[22] Filed: Jul. 19, 1995

[30] Foreign Application Priority Data

Jul. 20, 1994 [GB] United Kingdom ............... 9414639

[51] Int. Cl.⁶ .................... G01T 1/24; H01L 31/115
[52] U.S. Cl. .................... 250/370.09; 250/580
[58] Field of Search .................. 250/370.09, 580

[56] References Cited

U.S. PATENT DOCUMENTS

| 5,132,541 | 7/1992 | Conrads et al. ............... 250/370.01 |
| 5,319,206 | 6/1994 | Lee et al. ................... 250/370.09 |
| 5,396,072 | 3/1995 | Schiebel et al. .............. 250/370.09 |
| 5,498,880 | 3/1996 | Lee et al. ................... 250/370.09 |

FOREIGN PATENT DOCUMENTS 0444720  9/1991  European Pat. Off. .
0588397  3/1994  European Pat. Off. .

Primary Examiner—Constantine Hannaher
Attorney, Agent, or Firm—Steven R. Biren

[57] ABSTRACT

An image detector (1, 1a) has an array (2) of sensors (3) formed from layers of material provided on a substrate (4) and separated from a biasing electrode (5) by a radiation conversion layer (6) in which charge carriers are generated in response to incident radiation. Each sensor has a collecting electrode (7a, 7b) for collecting charge carriers generated in the radiation conversion layer (6), a capacitor (c) for storing charge and a switching element (8) having at least first and second electrodes (9 and 10) with one (10) of the first and second electrodes being coupled to the collecting electrode (7a, 7b) for enabling charge carriers stored at the sensor (3) to be read out. Each collecting electrode (7a, 7b) extends laterally beyond the associated switching element (8) on an insulating layer (12a, 12b) provided over the switching elements to form the associated capacitor (c) with an underlying reference electrode (12a, 12b) separated from the collecting electrode (7a, 7b) by the insulating layer (11a, 11b).

20 Claims, 3 Drawing Sheets

IMAGE DETECTOR

BACKGROUND OF THE INVENTION

1. Field of the Invention

This invention relates to an image detector for sensing radiation.

2. Description of the Related Art

EP-A-0588397 describes an image detector for sensing radiation, in particular x-ray radiation, which comprises an array of sensors formed from layers of material provided on a substrate and separated from a biasing electrode by a radiation conversion layer in which charge carriers are generated in response to incident radiation. Each sensor has a collecting electrode for collecting charge carriers generated in the radiation conversion layer, a capacitor for storing charge and a switching element having at least first and second electrodes. One of the first and second electrodes of the switching element of each sensor is coupled to the collecting electrode for enabling charge stored at the sensor to be read out. Each collecting electrode extends laterally beyond the associated switching element to form the associated capacitor with an underlying reference electrode. In the examples described in EP-A-0588397, the reference electrode is separated from the collecting electrode by the same insulating layer as that used to form the gate insulating layer of the thin film transistors forming the switching element. Accordingly, the thickness of this layer cannot be varied without affecting the threshold characteristics of the switching elements which may, under certain circumstances, not be desirable.

SUMMARY OF THE INVENTION

It is an aim of the present invention to provide an image detector which avoids or at least mitigates the above mentioned problem.

According to the present invention, there is provided an image detector for sensing radiation, comprising an array of sensors formed from layers of material provided on a substrate and separated from a biasing electrode by a radiation conversion layer in which charge carriers are generated in response to incident radiation, each sensor comprising a collecting electrode for collecting charge carriers generated in the radiation conversion layer, a capacitor for storing charge and a switching element having at least first and second electrodes with one of the first and second electrodes being coupled to the collecting electrode for enabling charge carriers stored at the sensor to be read out, each collecting electrode extending laterally beyond the associated switching element on an insulating layer provided over the switching elements to form the associated capacitor with an underlying reference electrode separated from the collecting electrode by the insulating layer.

Thus, in an image detector in accordance with the invention, the insulating layer separating the reference electrode from the overlying collecting electrode is not involved in the functional construction of the switching element and accordingly the characteristics of this insulating layer, in particular its thickness, can be adjusted so as to achieve the desired capacitance without affecting the characteristics of the switching element.

The reference electrode may be formed from the same layer of material as the one electrode. This provides a relatively simple structure and should facilitate manufacture of the image sensor.

In another example, for each sensor, the reference electrode may be provided on a further insulating layer which is thick in comparison to the layers forming the sensors and which extends over the switching elements, the insulating layer being provided over the reference electrode. The provision of the relatively thick further insulating layer allows the area of the collecting electrodes to be maximised while minimising cross-talk and read out capacitance.

Each collecting electrode may be provided on the insulating layer and may make contact with the associated one electrode via an aperture formed through the insulating layer over the one electrode.

Each switching element may comprise a thin film transistor and each thin film transistor may comprise a staggered thin film transistor having its gate electrode closest to the substrate.

Generally, the reference electrodes are coupled together for connection to common potential.

The switching elements may be arranged in a two dimensional matrix array.

BRIEF DESCRIPTION OF THE DRAWING

Embodiments of the present invention will now be described, by way of example, with reference to the accompanying drawings, in which.

It should of course be understood that the drawings are not to scale and that like reference numerals are used throughout text to refer to like parts.

DETAILED DESCRIPTION OF THE PREFERRED EMBODIMENTS

Figure 1:
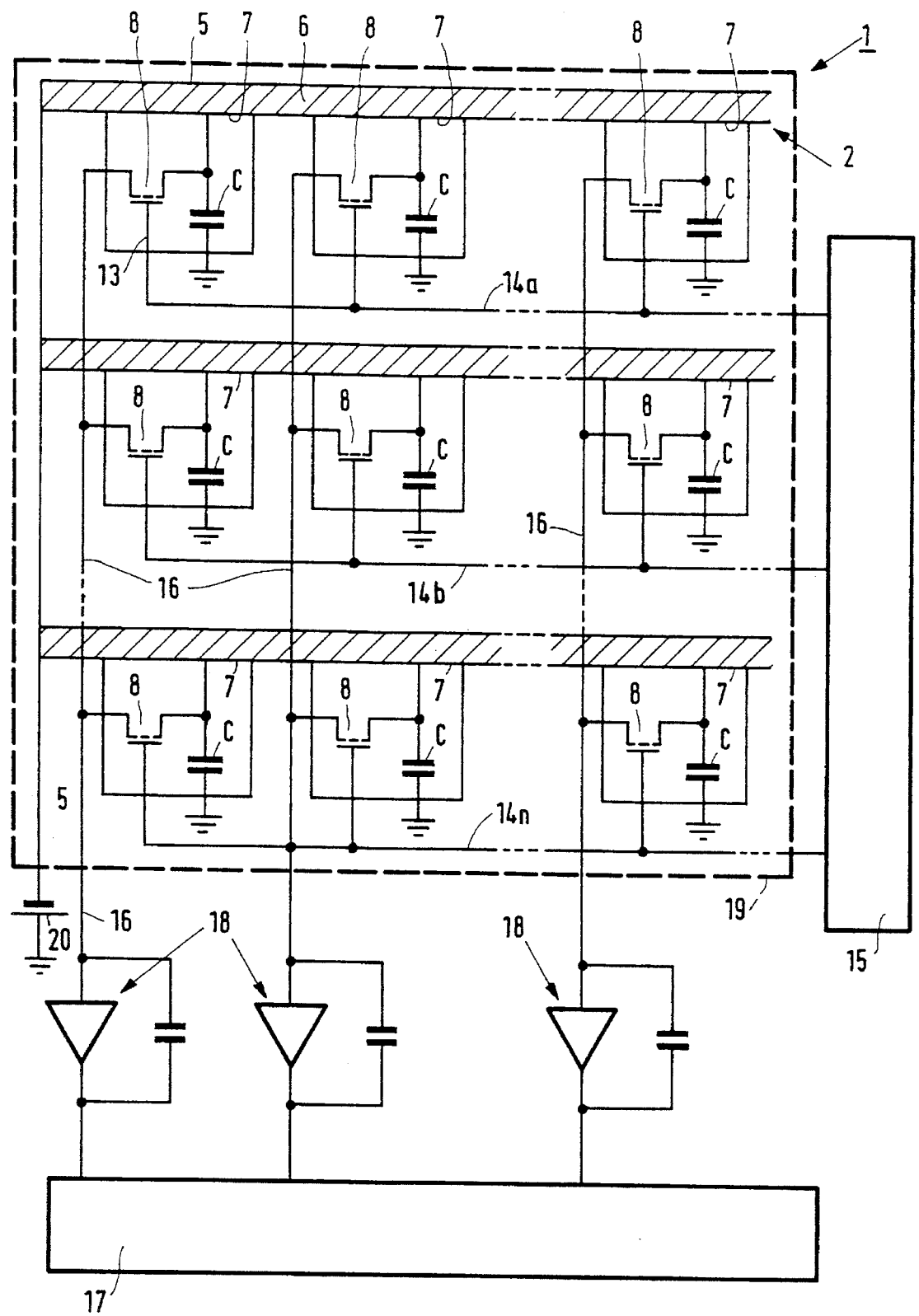
FIG. 1 shows one example of a schematic block circuit layout for an image sensor in accordance with the invention.

Referring now to the drawings, there is illustrated an image detector 1, 1a and 1b for sensing radiation, comprising an array 2 of sensors 3 formed from layers of material provided on a substrate 4 and separated from a biasing electrode 5 by a radiation conversion layer 6 in which charge carriers are generated in response to incident radiation, each sensor 3 comprising a collecting electrode 7a, 7b for collecting charge carriers generated in the radiation conversion layer 6, a capacitor C for storing charge and a switching element 8 having at least first and second electrodes 9 and 10 with one 10 of the first and second electrodes being coupled to the collecting electrode 7a, 7b for enabling charge carriers stored at the sensor 3 to be read out, each collecting electrode 7a, 7b extending laterally beyond the associated switching element 8 on an insulating layer 11a, 11b provided over the switching elements 3 to form the associated capacitor C with an underlying reference electrode 12, 12a, 12b separated from the collecting electrode 7a, 7b by the insulating layer.

Thus, in an image detector 1, 1a in accordance with the invention, the insulating layer separating the reference electrode 12, 12a, 12b from the overlying collecting electrode 7a, 7b is not involved in the functional construction of the switching element 8 and accordingly the characteristics of this insulating layer 11a, 11b in particular its thickness, can be adjusted so as to achieve the desired capacitance without affecting the characteristics of the switching element 8.

Turning firstly to FIG. 1, a possible schematic circuit layout for an image sensor in accordance with the invention is shown. In the example illustrated, the image sensor 1 comprises a two dimensional array of imaging elements or sensors 3. Each imaging element 3 comprises a switching element 8 in the form of a thin film transistor, an associated capacitor C and a collecting electrode 7.

As can be seen from FIG. 1, in each imaging element or sensor 3, the respective collecting electrode 7 is coupled to the drain of the associated thin film switching transistor 8 and to one electrode of the associated capacitor C, the other electrode of the associated capacitor C being connected to a suitable reference potential, generally ground or earth, normally by means of a common conductor.

The transistor switching elements 8 are arranged in a matrix of rows and columns, of which only three rows and three columns are shown in FIG. 1. The gates of each transistor 8 in a given row are coupled to the same row conductor 14 of a row driver or decoder/addressing circuit 15 while the source electrodes of each thin film transistor 8 in a given column are coupled via the same column conductor 16 and an associated charge sensitive readout amplifier 18 to an appropriate column decoder/readout circuit 17.

As will be appreciated by those skilled in the art, the array will in practice comprise many more imaging elements 3 than are shown in FIG. 1.

The dashed line 19 in FIG. 1 indicates the area or bounds of the photosensitive array 2.

The actual detection of radiation is achieved by means of a radiation conversion layer 6 in which charge carriers are generated in response to incident radiation. For simplicity this layer is referred to as a photoconductive layer and is shown merely schematically in FIG. 1. As will be evident from the following description, the photoconductive layer 6 covers the entirety of the array and is itself covered by a biasing electrode 5 which, in use of the image sensor, will be coupled to a suitable bias voltage source 20.

The actual nature of the photoconductive layer 6 will depend upon the particular radiation to be sensed. The radiation may be electromagnetic radiation or even, possibly, particulate radiation. For example, if the electromagnetic radiation spectrum from the ultraviolet to the infra red is considered then materials such as zinc oxide cadmium sulphide, silicon and germanium may be considered for forming the photoconductive layer 6 with, as will be appreciated by those skilled in the art, zinc oxide being most suitable for detecting ultra violet radiation and germanium for detecting infra red radiation. If the radiation to be detected is X-ray radiation then other suitable materials, such as selenium may be used.

Where the radiation to be used is X-ray radiation it may be advantageous, as discussed in EP-A-0588397, to form the photoconductive layer as a multi-layer structure comprising a semi-conductor layer which is a better conductor for positive than for negative charge carriers such as $HgI_2$, CdSe, CdTe, PbO or Se, of which the conductivity can be adjusted by means of appropriate doping. For example, the semiconductor layer may comprise a selenium layer having a thickness between 1 and 5 micrometres and doped with from 22–100 parts per million of chlorine. The actual photoconductor is provided on this doped semiconductor layer and may be, for example, a layer of amorphous selenium to which from 0.1–1% of arsenic is added. This photoconductor should, of course, have sufficient thickness to achieve adequate absorption of, in this case, X-ray radiation during, for example, a medical examination. Typically, the amorphous selenium layer may have a thickness of between 200–800 micrometres. A further doped semiconductor layer is provided over the photoconductor layer. This further semiconductor layer is in this example, doped so that, in contrast to the first semiconductor layer, it conducts negative charge carriers better than positive charge carriers. This layer may consist of, for example, selenium doped with from 20–200 parts per million of a suitable alkaline metal such as lithium, sodium, potassium or caesium and may typically have a thickness of between 0.5 and 2 micrometres.

The image detector 1 as described so far operates in the manner described in EP-A-0588397. Thus, during operation, a positive voltage of between 1 and 10 kilovolts is applied to the bias electrode 5. The doped semiconductor layers bounding the photoconductor layer should then block charge carriers injected by the collecting electrode 7 or bias electrode 5 in the manner described in EP-A-0588397 so that the dark current is significantly reduced.

An image is sensed or read in a manner similar to that described in EP-A-444720. Thus, initially, before the image detector is exposed to the electromagnetic radiation forming the image, the switching elements 8 are rendered conductive (by applying appropriate signals to the row conductors 14) to ensure that the capacitors C are discharged.

In order to enable sensing of an image, the switching elements 8 are rendered non-conductive by signals applied to the appropriate row conductors 14. During this so called integration period when the switches 8 are rendered non-conducting, the capacitors C store charge collected by the respective collecting electrodes 7 and representative of the electromagnetic radiation incident on the associated imaging element or sensor 3. The high electric field between each collecting electrode 7 and the bias electrode 5 inhibits cross-talk between sensors or imaging elements 3.

Generally, a stored image will be read out by reading the charge stored in the image detector a row at a time. Thus, appropriate voltages will be applied in sequence to the row conductors 14 so that the charge stored at the first row 14a, then the second row 14b and so on to the final row 14n are read out in sequence. As will be appreciated by those skilled in the art, during the read out period, charge stored by the capacitor of a particular imaging element 3 in the row being read flows down the associated column conductor 16 and is integrated by the associated charge sensitive amplifier 18. During this period, the collecting electrodes 7 are maintained virtually at ground (earth). The output signals of the charge sensitive amplifiers 18 are supplied to the column read out circuitry 17 which generally will convert the parallel signals into a serial signal suitable for use as a video or TV signal which may, for example, be stored in an appropriate memory for later display.

Examples of image detectors in accordance with the invention will now be described in greater detail with the help of FIGS. 2 and 3 and 4 and 5.

In each of these examples, the array 2 of the image sensor is formed using thin film technology on an insulative, generally glass or a plastics material, substrate 4. Normally, the row decoder and addressing circuitry 15 and the column decode and readout circuitry 17 will be formed on separate substrates to enable the required components to be optimised for their particular functions. These circuits may have any appropriate conventional form and will not be discussed further herein.

Figure 2:
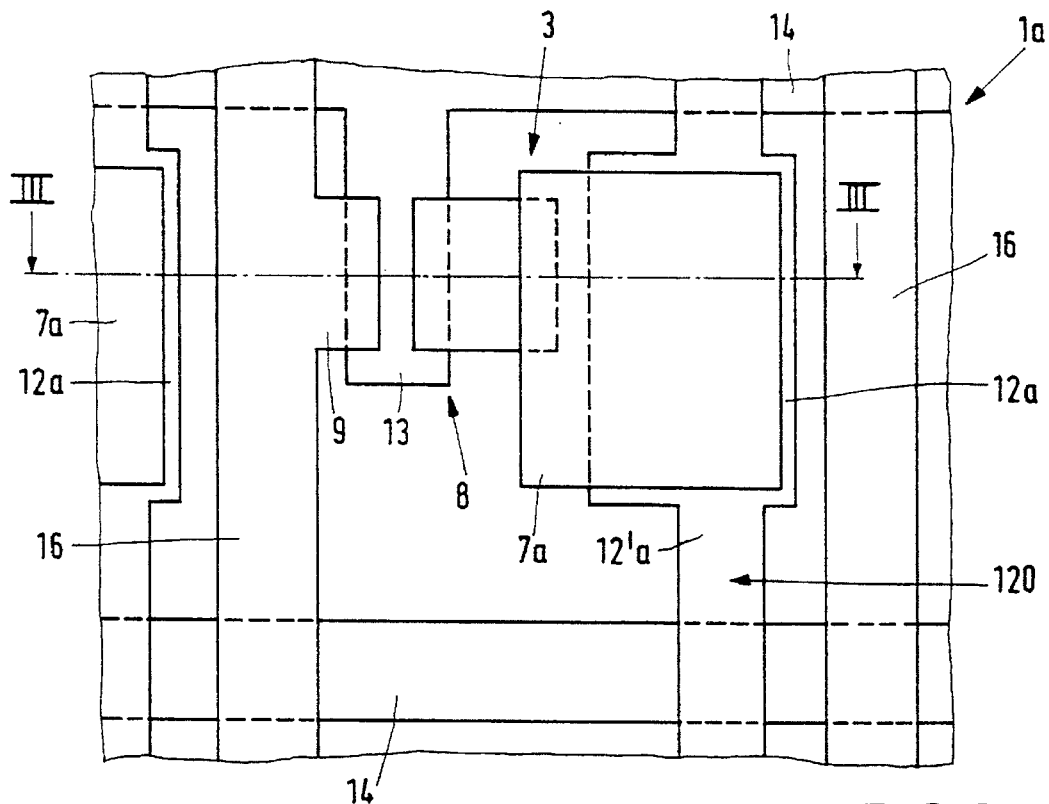
FIG. 2 shows a possible layout of one imaging element of one example of an image sensor in accordance with the invention.
Figure 3:
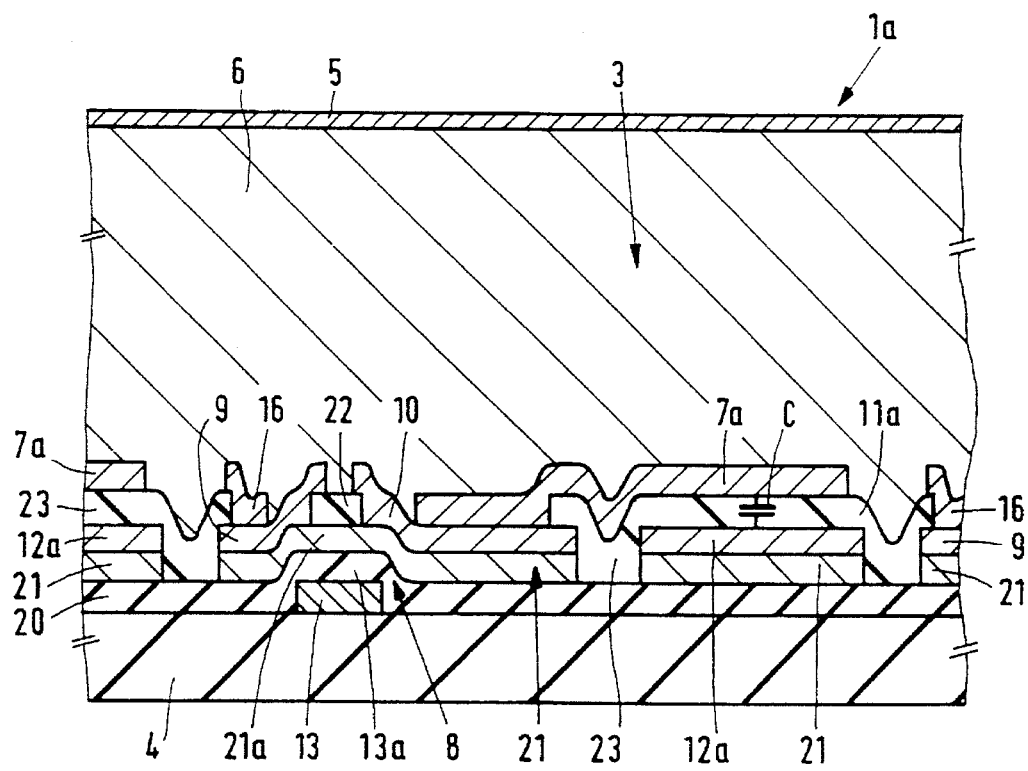
FIG. 3 shows a cross-sectional view taken along line III—III in FIG. 2 of the imaging element shown in FIG. 2.

FIGS. 2 and 3 illustrate one example of an image detector 1a in accordance with the invention. In particular, FIGS. 2 and 3 show a possible layout and a cross-sectional view through one imaging element 3 of the image detector 1a.

As illustrated in FIG. 3, the image detector 1a is formed by depositing thin film layers onto an insulative, generally glass or plastic, material substrate 4.

In this example, the switching elements 8 comprise inverted staggered thin film transistors and accordingly the first layer provided on the substrate 4 is a layer suitable for forming gate electrodes 13 of the thin film transistors (TFTs) 8 and the associated row conductors 14. The gate electrodes 13 may be formed of any suitable electrically conductive material such as chromium and may be formed integrally with the associated row conductors 14, although a further more conductive layer may be provided over the row conductors 14 to reduce the series resistance.

After patterning of the conductive layer to form the gate electrodes 13 and the row conductors 14, an insulating layer 20 is provided over the structure to form the gate insulating regions 13a of the TFTs 8. Generally, the insulating layer 20 may comprise any suitable insulating material such as silicon dioxide, silicon nitride or a combination of those two materials.

The insulating layer 20 is covered by a layer 21 of an appropriate intrinsic, that is not intentionally doped, semiconductor layer such as a layer of amorphous silicon. An optional further protective insulating layer, generally of silicon nitride, may then be deposited and patterned to define insulating areas (not shown) over the row conductors 14 to increase the thickness of the overlying insulating, thereby reducing parasitic capacitances, and to provide a protective region 22 over a central region of each transistor 8 to act as an etch stop.

As will be appreciated by those skilled in the art, although not shown in FIG. 3 a doped semiconductor layer, generally of the same material as the intrinsic layer 21, may then be deposited to form source and drain semiconductor contact regions. Of course, in the case of an N channel TFT, the doped semiconductor layer will be doped with N conductivity type of impurities. A metallisation layer, which may be formed of the same material as the gate electrodes 13, is then deposited and the semiconductor layer 21 (and doped semiconductor layer if present) and further conductive layer are then defined using conventional photolithographic and etching techniques to form the conduction channel regions 21a and the source and drain electrodes 9 and 10 of the TFTs 8 and the reference electrodes 12a. A further insulating layer 23 is then deposited and photolithographically defined to form contact windows. This insulating layer provides the insulating or dielectric layers 11a of the capacitors C. A further metallisation layer, which may be formed of any suitable material, for example, aluminium, is then deposited and defined to form the collecting electrodes 7a, the column conductors 16 and any resistance reducing further conductive part of the row conductors 14.

The image detector 1a structure is then completed by depositing the photoconductive layer 6 and the bias electrode 5. As indicated above the actual material and construction of the photoconductive layer 6 will depend upon the type of radiation to be sensed. Where X-ray radiation is to be sensed, then although not shown in FIG. 3, the photoconductor layer 6 may be a multi-layer structure as shown in EP-A-0588397 or any other suitable photoconductive layer may be provided.

As can be seen from FIG. 2, the imaging element or sensors 3 have a generally rectangular structure bounded by the row and column conductors 14 and 16. Although not shown as such in FIG. 2, it will be appreciated by those skilled in the art that each reference electrode 12a and associated overlying collecting electrode 7a may be shaped so as to obtain the desired capacitance for the capacitor C. However, although not shown in FIG. 2, in order to maximise the collecting area, it is desirable for the collecting electrode 7a to occupy as much as is practically feasible of the area bounded by the row and column conductors 14 and 16 which is not occupied by the TFT 8. As shown in FIG. 2, the reference electrodes 12a are coupled to strips 12'a to form a common conductor 120 for connection to any suitable reference potential, generally earth, during operation of the device 1a. Again, however it may be desirable for the reference electrode 12a effectively to be formed as a continuous layer with apertures and gaps only being provided where necessary, for example to enable definition of the source and drain electrodes 9 and 10. Of course, one or more of the respective areas and overlaps of the reference electrodes 12a and corresponding collecting electrodes and the thickness and/or material of the insulating layer 11a may be adjusted to achieve a desired capacitance (for example a capacitance equivalent to or greater than the self capacitance of a pin diode formed by thin film technology) while at the same time achieving the desired area for the collecting electrodes 7a.

As can be seen most clearly from FIG. 3, the drain electrode 10 and underlying intrinsic semiconductor layer 21 of each TFT 8 extends laterally beyond the gate electrode 13 further than is necessary for the operation of the TFT 8 to enable connection to the drain electrode 10 of the collecting electrode 7a. The collecting electrode 7a itself extends itself laterally beyond the drain electrode 10 so as to enable collection of charge carriers as discussed above. The reference electrode 12a is formed from the same layer as the source and drain electrodes 9 and 10 which facilitates and simplifies manufacture of the image detector 1a. Moreover the dielectric layer 11a of the capacitor C is formed by the insulating layer 23 which does not itself contribute to the operational characteristics of the TFT 8 and accordingly the characteristics of the dielectric layer 11a, such as its thickness and material composition, can be optimised to obtain the desired dielectric constant and thickness for the capacitor C.

Figure 4:
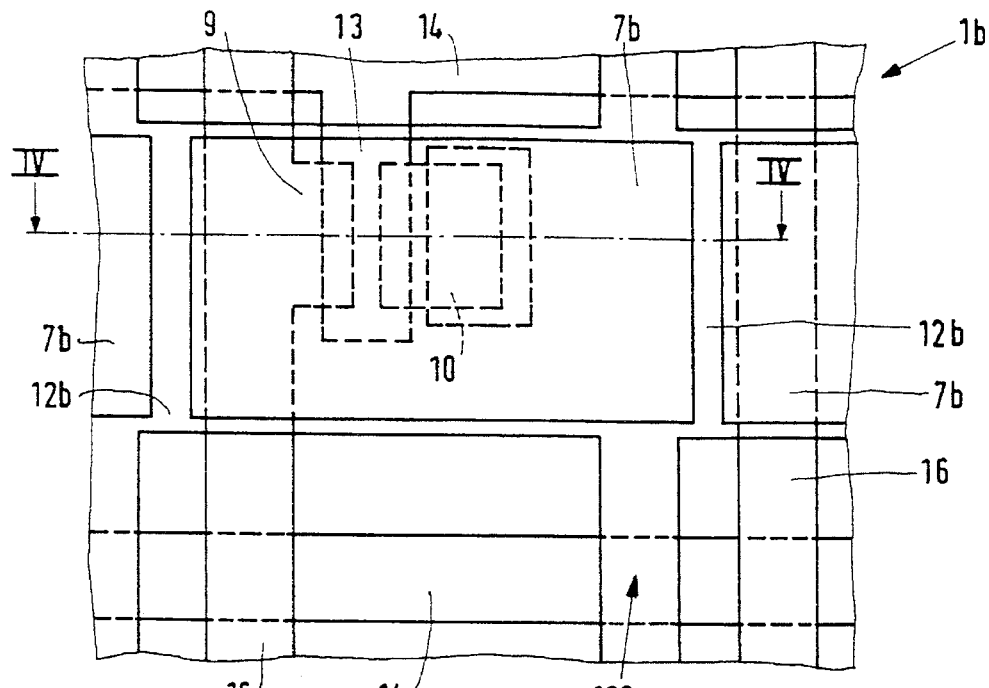
FIG. 4 shows a possible layout of one imaging element of another example of an image sensor in accordance with the invention.
Figure 5:
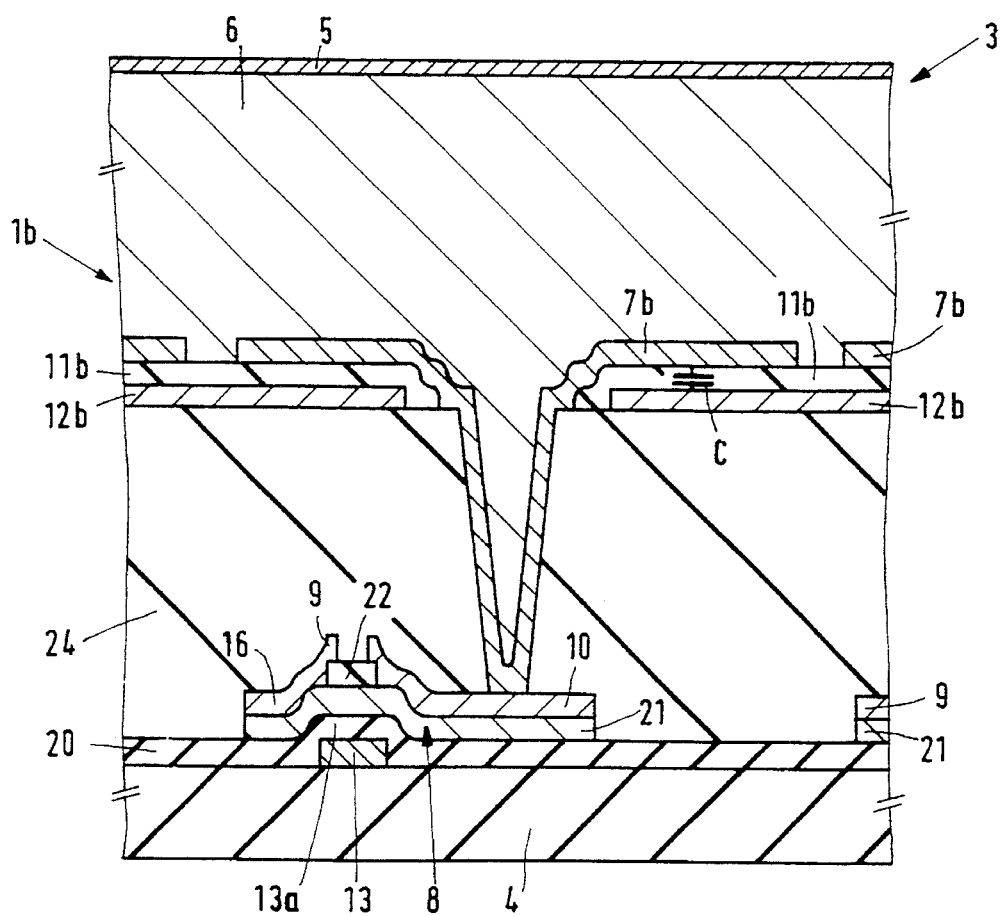
FIG. 5 shows a cross-sectional view taken along line V—V in FIG. 4 of the imaging element shown in FIG. 4.

FIGS. 4 and 5 show, respectively, a possible layout and schematic and cross-sectional view through one imaging element 3 of another example of an image detector 1b in accordance with the invention.

As in the example illustrated in FIGS. 2 and 3, the image detector is formed by the deposition of thin films onto an insulative, generally glass or plastic material substrate 4. Again, the switching elements 8 are in the form of thin film transistors (TFTs) having an inverted staggered structure.

In this case the structure is formed initially in a similar manner to that described above with reference to FIGS. 2 and 3. Thus, first the gate electrodes 13 of the TFTs 8 and the associated row conductors 14 are defined and then the insulating layer 20 for forming the gate insulating regions 13a is deposited followed by the intrinsic semiconductor layer 21 (and any doped semiconductor layer for forming source and drain contact regions as discussed above). Again each TFT8 may have an etch stop region 22. A further conductive layer, again generally chromium, is then deposited and together with the semiconductor layer 21 (and doped layer if present) defined so that the intrinsic layer 21 forms the conduction channel regions 13a of the TFTs and the further conductive layer forms the source electrodes 9, integrally with the column conductors 16, and the drain electrodes 10.

In contrast to the example described with reference to FIGS. 2 and 3, in this example a thick insulating layer 24 is provided over the thin film transistors 8. The thick insulating layer 24 may be formed of any suitable material which can be provided using a compatible process, for example polyimide, silicon dioxide or silicon nitride, and may have a thickness in the region of 5 micrometres. A further metallisation layer of any suitable material such as chromium is then provided on the thick insulating layer and defined to form the reference electrodes 12b. The use of a flowable insulating material such as polyimide or a spin-off glass may have advantages in facilitating the formation of a thick insulating layer 24 having a flat surface. A thin film insulating layer 26, again generally of silicon dioxide or silicon nitride, is then provided over the reference electrodes 12b for forming the dielectric regions 11b of the capacitor C. Apertures or contact windows are then formed through the thin insulating layer 11b and the underlying thick insulating layer 24 to expose a respective contact area of each drain electrode 10. A further metallisation layer of any suitable material such as aluminium is then deposited and patterned to define the collecting electrodes 7b so that each collecting electrode 7b contacts the respective drain electrode 10 and extends laterally of the switching element 8 over the thin insulating region 11b to form the associated capacitor C. The structure is then continued as described in EP-A-0588397.

As in the example described with reference to FIGS. 2 and 3, the dielectric region 11b of the capacitor C is formed by an insulating layer 26 which does not affect the operational characteristics of the switching elements 8 and so its properties, for example its composition and thickness, can be optimised for the capacitor C. Furthermore the use of the thick insulating layer 24 in the example shown in FIGS. 4 and 5 enables, as can be seen most clearly from FIG. 4, the collecting electrodes 7b to cover virtually the entirety of the switching element structure, so as to maximise the collecting area, without significantly increasing parasitic capacitance problems. Indeed, the presence of the thick insulating region 24 enables the collecting electrode 7b to, as shown in FIG. 4, extend over the readout line or column conductor 16 without significantly increasing parasitic readout capacitance problems. The area of the reference electrode 12b of each imaging element or sensor 3 may similarly be made as large as possible and may also, if desired, extend over the associated column conductor 16.

In the possible layout structure shown in FIG. 4, the collecting electrode 7b of each imaging element 3 extends over a major portion of the area bounded by the row and column conductors 14 and 16. In this example, the associated collecting electrode 7b overlaps the column conductor 16 of that imaging element 3 (that is the column conductor coupled to the switching element 8) and extends nearly to the column conductor 16 of the next imaging element 3 in that row. The underlying reference electrodes 12b are, as in the example described with reference to FIGS. 2 and 3, coupled together to form a common conductor 120 which is connected to a reference potential, generally earth in operation of the device. Although in the example illustrated in FIG. 4, the reference electrodes 12b are coupled by means of integrally formed conductive strips in a manner similar to that shown in FIG. 2, the reference electrode 12b may be formed as a single conductive layer with apertures only at the areas where the reference electrodes 7b extend through the thick insulating layer to contact the drain electrodes 10.

Of course, as in the above example, one or more of the respective areas and overlap of the reference electrodes 12b and corresponding collecting electrodes 7b and the thickness and/or material of the insulating layer 11b may be adjusted to achieve a desired capacitance (for example a capacitance equivalent to or greater than the self capacitance of a pin diode formed by thin film technology) while at the same time achieving the desired area for the collecting electrodes 7b.

Although the examples described above refer to the formation of the switching elements 8 as thin film transistors, other forms of switching elements may be used such as thin film diodes, pin diodes or diode combinations. In addition it may be possible to form the switching elements 8 using conventional bulk semiconductor technology, that is by forming diffused regions within a semiconductor body rather than by depositing layers onto an insulative substrate.

From reading the present disclosure, other modifications and variations will be apparent to persons skilled in the art. Such modifications and variations may involve other features which are already known in the art and which may be used instead of or in addition to features already described herein.

We claim:

1. An image detector for sensing radiation, comprising an array of sensors formed from layers of material provided on a substrate and separated from a biasing electrode by a radiation conversion layer in which charge carriers are generated in response to incident radiation, each sensor comprising a collecting electrode for collecting charge carriers generated in the radiation conversion layer, a capacitor for storing charge and a switching element having at least first and second electrodes on a first insulating layer with one of the first and second electrodes being coupled to the collecting electrode for enabling charge carriers stored at the sensor to be read out, each collecting electrode extending laterally beyond the associated switching element on a second insulating layer provided substantially above said first insulating layer to form the associated capacitor with an underlying reference electrode separate from the collecting electrode by the second insulating layer.

2. An image detector according to claim 1, wherein the reference electrode is formed from the same layer of material as the one electrode.

3. An image detector according to claim 2, wherein each collecting electrode is provided on the second insulating layer and makes contact with the associated one electrode via an aperture formed through the second insulating layer over the one electrode.

4. An image detector according to claim 2, wherein each switching element comprises a thin film transistor.

5. An image detector according to claim 4, wherein each thin film transistor comprises a staggered thin film transistor having its gate electrode closest to the substrate.

6. An image detector according to claim 2, wherein the reference electrodes are coupled together for connection to a common potential.

7. An image detector according to claim 2, wherein the switching elements are arranged in a two dimensional matrix array.

8. An image detector according to claim 1, wherein, for each sensor, the reference electrode is provided on a further insulating layer which is thick in comparison to the layers forming the sensors and which extends over the switching elements, the second insulating layer being provided over the reference electrode.

9. An image detector according to claim 8, wherein each collecting electrode is provided on the second insulating layer and makes contact with the associated one electrode via an aperture formed through the second insulating layer over the one electrode.

10. An image detector according to claim 8, wherein each switching element comprises a thin film transistor.

11. An image detector according to claim 10, wherein each thin film transistor comprises a staggered thin film transistor having its gate electrode closest to the substrate.

12. An image detector according to claim 8, wherein the reference electrodes are coupled together for connection to a common potential.

13. An image detector according to claim 8, wherein the switching elements are arranged in a two dimensional matrix array.

14. An image detector according to claim 1, wherein each collecting electrode is provided on the second insulating layer and makes contact with the associated one electrode via an aperture formed through the second insulating layer over the one electrode.

15. An image detector according to claim 14, wherein each switching element comprises a thin film transistor.

16. An image detector according to claim 14, wherein the reference electrodes are coupled together for connection to a common potential.

17. An image detector according to claim 1, wherein each switching element comprises a thin film transistor.

18. An image detector according to claim 17, wherein each thin film transistor comprises a staggered thin film transistor having its gate electrode closest to the substrate.

19. An image detector according to claim 1, wherein the reference electrodes are coupled together for connection to a common potential.

20. An image detector according to claim 1, wherein the switching elements are arranged in a two dimensional matrix array.

* * * * *